United States Patent [19]

Volpe

[11] B 3,921,166

[45] Nov. 18, 1975

[54] CAPACITANCE MATRIX KEYBOARD

[75] Inventor: John W. Volpe, Rockland, Mass.

[73] Assignee: Raytheon Company, Lexington, Mass.

[22] Filed: Sept. 15, 1972

[21] Appl. No.: 289,523

[44] Published under the Trial Voluntary Protest Program on January 28, 1975 as document no. B 289,523.

[52] U.S. Cl........ 340/365 C; 340/166 R; 340/324 A

[51] Int. Cl.$^{2}$.......................................... H04L 15/06

[58] Field of Search......... 340/365 C, 365 E, 365 S, 340/146.1 AB

[56] References Cited

UNITED STATES PATENTS

| | | | |
|---|---|---|---|
| 904,008 | 11/1972 | Crouse | 340/365 C |
| 3,437,795 | 4/1969 | Kuljian | 340/365 C |
| 3,588,875 | 6/1971 | Gabor | 340/365 C |
| 3,623,082 | 11/1971 | Stein et al. | 340/365 S |
| 3,651,463 | 3/1972 | Rawson et al. | 340/365 S |
| 3,662,378 | 5/1972 | MacArthur | 340/365 S |
| 3,675,239 | 7/1972 | Ackerman | 340/365 E |
| 3,683,371 | 8/1972 | Holz | 340/365 L |

*Primary Examiner*—Thomas B. Habecker
*Attorney, Agent, or Firm*—John R. Inge; Joseph D. Pannone; Milton D. Bartlett

[57] ABSTRACT

An electronic system having a keyboard for entry of digitally coded data on a carrier wherein capacitive switches operated by the keyboard program a matrix which is scanned to produce digitally coded data trains.

12 Claims, 6 Drawing Figures

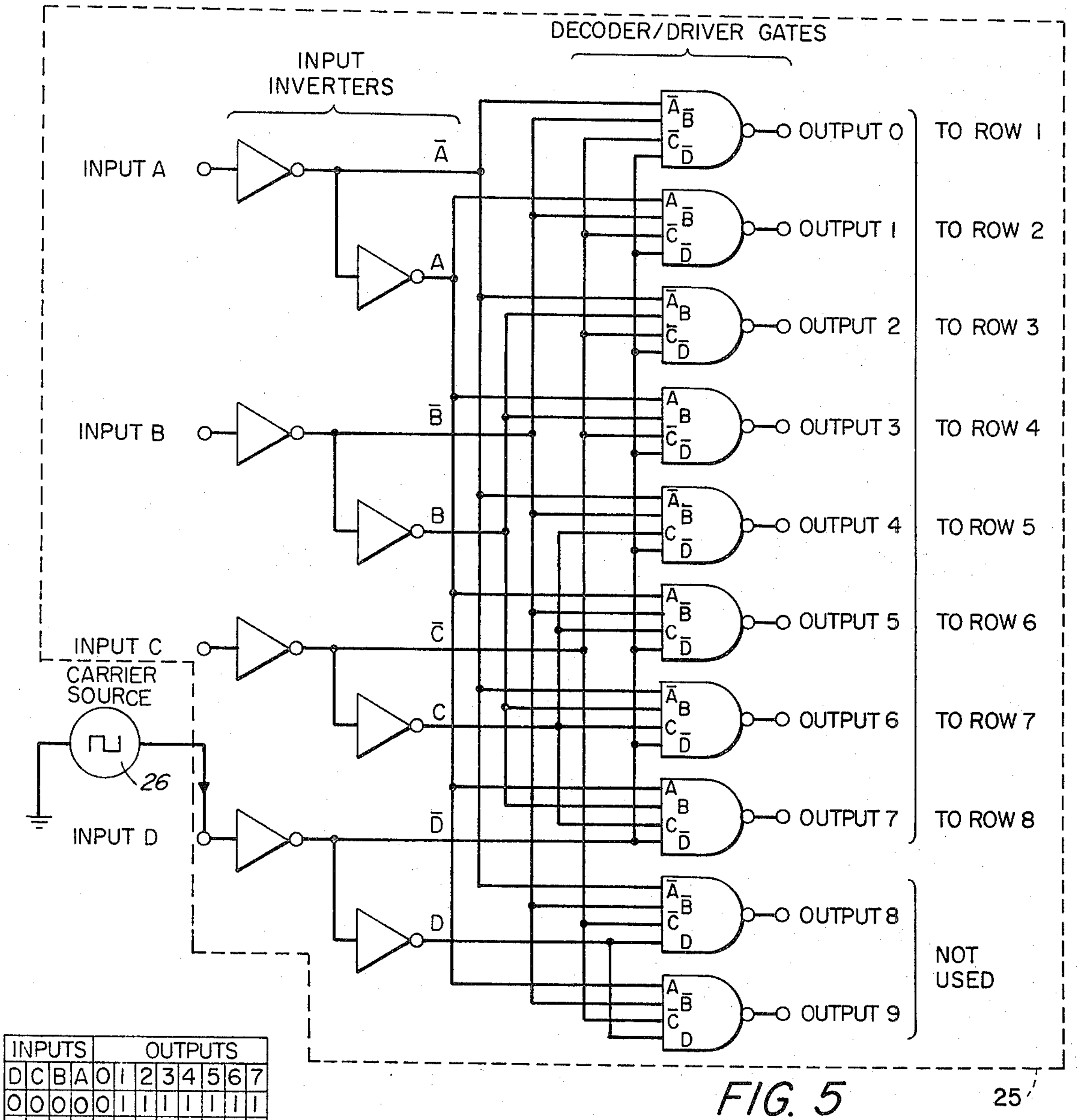
FIG. 5
| INPUTS | | | | OUTPUTS | | | | | | | |
|---|---|---|---|---|---|---|---|---|---|---|---|
| D | C | B | A | 0 | 1 | 2 | 3 | 4 | 5 | 6 | 7 |
| 0 | 0 | 0 | 0 | 0 | 1 | 1 | 1 | 1 | 1 | 1 | 1 |
| 0 | 0 | 0 | 1 | 1 | 0 | 1 | 1 | 1 | 1 | 1 | 1 |
| 0 | 0 | 1 | 0 | 1 | 1 | 0 | 1 | 1 | 1 | 1 | 1 |
| 0 | 0 | 1 | 1 | 1 | 1 | 1 | 0 | 1 | 1 | 1 | 1 |
| 0 | 1 | 0 | 0 | 1 | 1 | 1 | 1 | 0 | 1 | 1 | 1 |
| 0 | 1 | 0 | 1 | 1 | 1 | 1 | 1 | 1 | 0 | 1 | 1 |
| 0 | 1 | 1 | 0 | 1 | 1 | 1 | 1 | 1 | 1 | 0 | 1 |
| 0 | 1 | 1 | 1 | 1 | 1 | 1 | 1 | 1 | 1 | 1 | 0 |
| 1 | 0 | 0 | 0 | 1 | 1 | 1 | 1 | 1 | 1 | 1 | 1 |
| 1 | 0 | 0 | 1 | 1 | 1 | 1 | 1 | 1 | 1 | 1 | 1 |
| 1 | 0 | 1 | 0 | 1 | 1 | 1 | 1 | 1 | 1 | 1 | 1 |
| 1 | 0 | 1 | 1 | 1 | 1 | 1 | 1 | 1 | 1 | 1 | 1 |
| 1 | 1 | 0 | 0 | 1 | 1 | 1 | 1 | 1 | 1 | 1 | 1 |
| 1 | 1 | 0 | 1 | 1 | 1 | 1 | 1 | 1 | 1 | 1 | 1 |
| 1 | 1 | 1 | 0 | 1 | 1 | 1 | 1 | 1 | 1 | 1 | 1 |
| 1 | 1 | 1 | 1 | 1 | 1 | 1 | 1 | 1 | 1 | 1 | 1 |
MSB LSB
FIG. 6
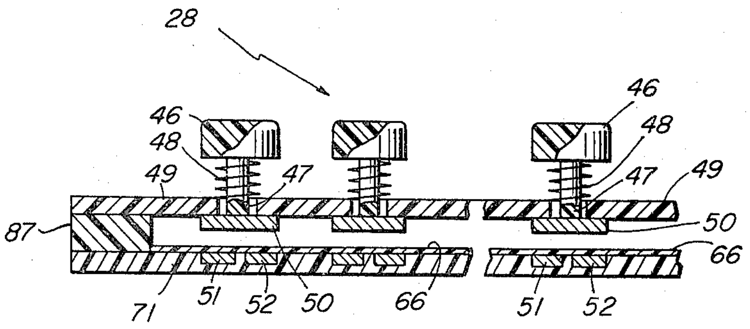
FIG. 4

CAPACITANCE MATRIX KEYBOARD

BACKGROUND OF THE INVENTION

Keyboards have employed simple mechanical switches at each key position which close when a key is depressed. One disadvantage with such systems is that the switches and the contacts may be exposed to the atmosphere hence becoming corroded or otherwise fouled. Keyboard switches are particularly prone to such contact problems in that keyboards are almost invariably located in high activity areas. Also, such switch contacts may bounce with this type of arrangement whereby the contacts will successively make and break contact several times each time a key is depressed before the contacts remain closed. One prior art approach to solving the contact corrosion and bounce problem was to employ reed relay switches whereby when a key is depressed, a magnet is moved close to a reed relay thereby closing the contacts. However, the contact bounce problem was not thereby solved. Also, the complexity of the key switch was increased considerably as well as its cost and difficulty of manufacture. One further prior art attempt to solve the contact problems was to use a magnet at each key position which was moved towards a Hall element when the key is depressed, thereby causing a voltage to appear at the output terminals of the Hall element as the magnetic field increases. With this approach, the cost of the keyboard was considerably increased because of the cost of the magnets and of the Hall elements as well as the manufacturing costs. Still other prior art approaches have used induction coils or saturable magnetic coils in conjunction with a magnet moved when the key is depressed. A substantial increase in cost and in manufacturing complexity resulted in that relatively expensive addressing and detection schemes are required to detect a key depression. Some prior art key switches have used capacitive techniques such as those where a dome-type disc is depressed by a key plunger and snapped towards two capacitive plates thereby inducing a voltage spike when the key is depressed. However, this system is susceptible to transients and other noise since it operates with only a single voltage spike for each key depression. Still other keyboard approaches have used a capacitive switch as in the present invention whereby as the key is depressed, a coupling plate is moved towards two capacitive plates thereby increasing the capacitance between the latter two plates. But, these prior art approaches using this type of capacitive switch have used a detector at each key switch position rather than using a scanning technique as with the present invention. Thus, the prior art key switches using this type of capacitive key switch cannot obtain the same economy and ease of manufacture combined with the elimination of contact bounce problems and contact corrosion problems as achieved with the present invention. No prior art approach has combined both the advantages of the prior art matrix scanning techniques with the advantages of the capacitive switches.

SUMMARY OF THE INVENTION

Accordingly, the present invention comprises means for generating digital data with a plurality of means for coupling carrier signals to utilization means for simultaneous assembly of a code corresponding to the alphabetic and/or numeric character selected by mechanical means and means for processing data in a data system. The invention is further described in the provision of means for applying carrier signals to a first set of conductors and means to selectively couple the carrier signals from one conductor within the first set of conductors to one conductor within a second set of conductors combined with means to detect the conductor within the first set of conductors to which the carrier signal is applied and to which conductor of the second set of conductors the carrier signal is coupled. The means for applying the carrier signals to the first set of conductors comprises a first means for generating a numerically ordered binary count driving a means for applying an activating signal to one conductor within the first set of conductors specific to one number in the count of the numerically ordered binary count where a means is provided to modulate the activating signal with the carrier signal. Capacitive key switches having first and second terminals with the first terminal connected to one conductor within the first set of conductors and the second terminal connected to one conductor within the second set of conductors comprise means to selectively couple the carrier signals from the first set of conductors to the second set of conductors. Furthermore, the means to detect to which conductor within the first set of conductors the carrier signals are applied and to which conductor within the second set of conductors the carrier signals are coupled comprise means to generate a second numerically ordered binary count, means to selectively couple the second set of conductors to a demodulator means one at a time in response to the binary count, means to demodulate the carrier signal from the activating signal, means to generate a first output state when the carrier signal is present and a second output state when the carrier is not present, and means to store the count from the first and second means for generating a numerically ordered binary count. In one embodiment of the invention N-key roll-over protection is provided with means to prevent the counts from the first and second means for generating a numerically ordered binary count from being stored more than once for each depression of a key switch. Furthermore, the means for applying an activating signal to each conductor of the first set of conductors one at a time in response to the first means for generating a numerically ordered binary count comprises means to convert from a binary code to a single activated line unique to each binary code number where the carrier signal is connected as the most significant bit of the binary code number.

In a still further embodiment of the invention, means are provided to produce a continuously cycling binary count whereby a carrier signal is applied to a first set of conductors one at a time in response to the higher order bits of the binary count and a second set of conductors, to which the carrier signal may be coupled, are coupled one at a time to a demodulator means in response to the lower order bits of the binary count. Furthermore, N-key roll-over protection may be accomplished by connecting shift register means to the output of a demodulator where the shift register means has the same delay time as the time required for a complete cycle of the continuously cycling binary counter. The output of the shift register cooperates with the output of the demodulator so as to prevent the count corresponding to a key switch from being stored more than once each time that key switch is depressed. In some embodiments of the invention the means for applying the carrier signal comprises a binary decoder to convert from a binary code to a single activated output line and a carrier signal source connected to the decoder as the most significant bit of the binary code. The means to couple the second set of conductors one at a time to a demodulator comprises a multiplexer means with a plurality of data inputs and a single data output.

A still further embodiment of the invention comprises a six-bit continuously cycling binary counter and a four line to ten line binary coded decimal-to-decimal decoder/driver with the three least significant bits of its input connected to the three most significant bits of the binary counter. A first set of eight conductors is connected to the zeroth through the seventh outputs of the decoder/driver while a second set of eight conductors is connected to an eight input multiplexer. A plurality of capacitive key switches having first and second terminals are connected between the sets of conductors with the first terminal connected to one conductor within the first set of conductors and the second terminal connected to one conductor within the second set of conductors. Also provided are means to amplify the signals on each of the second set of conductors before they are connected to an eight input digital data multiplexer. The three least significant bits of the binary counter are connected to the data selection inputs of the multiplexer while the output of the multiplexer is connected to demodulation means. A 64-bit shift register with clock input connected to the same clock source as the clock input of the six-bit continuously cycling binary counter and data input connected to the output of the demodulator is used for N-key roll-over protection. An output storage means having a plurality of data inputs and outputs and a single clock input provide the output code where some of the data inputs of the ouput storage means are connected to the outputs of the six-bit continuously cycling binary counter. Gating means where one or more of the inputs of the gating means are connected to the output of the shift register, to the output of the demodulator, and to the same clock source as the said six-bit continuously cycling binary counter and where the output of the gating means is connected to the clock input of the output storage means are also used in the N-key roll-over protection provision.

BRIEF DESCRIPTION OF THE DRAWINGS

FIG. 4 is a sectional elevation view of the capacitive key switches;

FIG. 5 is a logic diagram of the decoder of FIG. 2; and

FIG. 6 is a truth table for the decoder of FIG. 5.

DESCRIPTION OF THE PREFERRED EMBODIMENT

Figure 1:
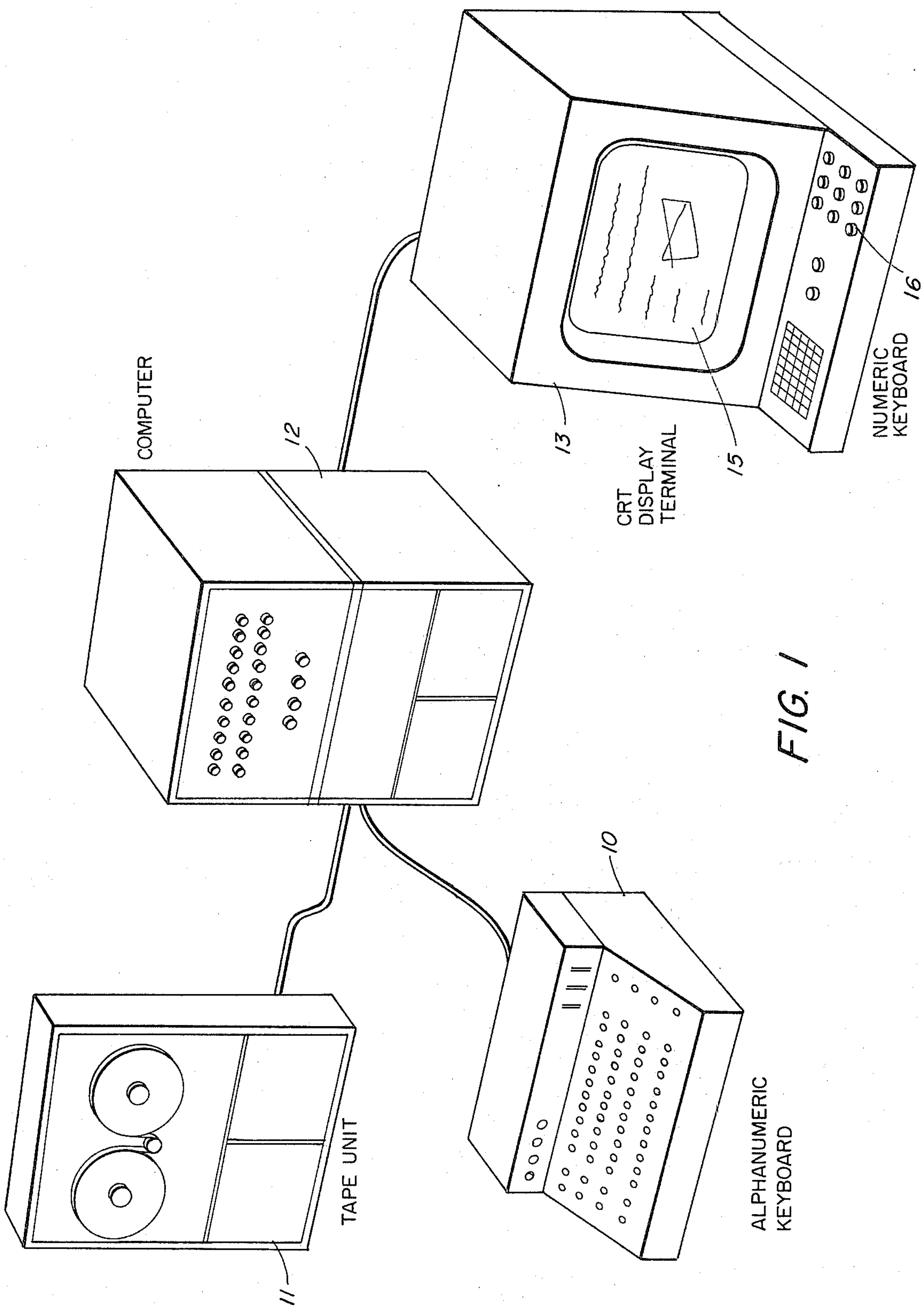
FIG. 1 is a perspective view of a system embodying the invention.

Referring now to FIG. 1, keyboard 10 can be used to enter data into computer 12 for display on CRT display terminal 13. Numeric keyboard 16 provides a data entry device for the CRT terminal 13. For example, in an airlines reservation system, hotel or motel reservation system, or air traffic control applications, the operator enters data through the alphanumeric keyboard 10 or through the numeric keyboard 16. If desired, the alphanumeric keyboard 10 and the numeric keyboard 16 may be combined and made physically a part of the CRT display terminal 13. Preferably, the operator enters data through these keyboards to the computer 12 which processes such data and puts it in the proper format for display on CRT display terminal 13 for visible presentation to the operator. A tape unit 11 may be included in such a system for purposes such as storing the display programs used to format the data or which store information to be later called up for presentation or use by the alphanumeric keyboard. In such an application, the operator would type in a code through either the alphanumeric keyboard 10 or the numeric keyboard 16 which causes the computer 12 to signal the tape unit 11 to search for a particular group of data words. These data words would be transferred from the tape unit 11 to the computer 12 for display by the CRT terminal 13 for viewing by the operator on CRT screen 15.

Figure 2:
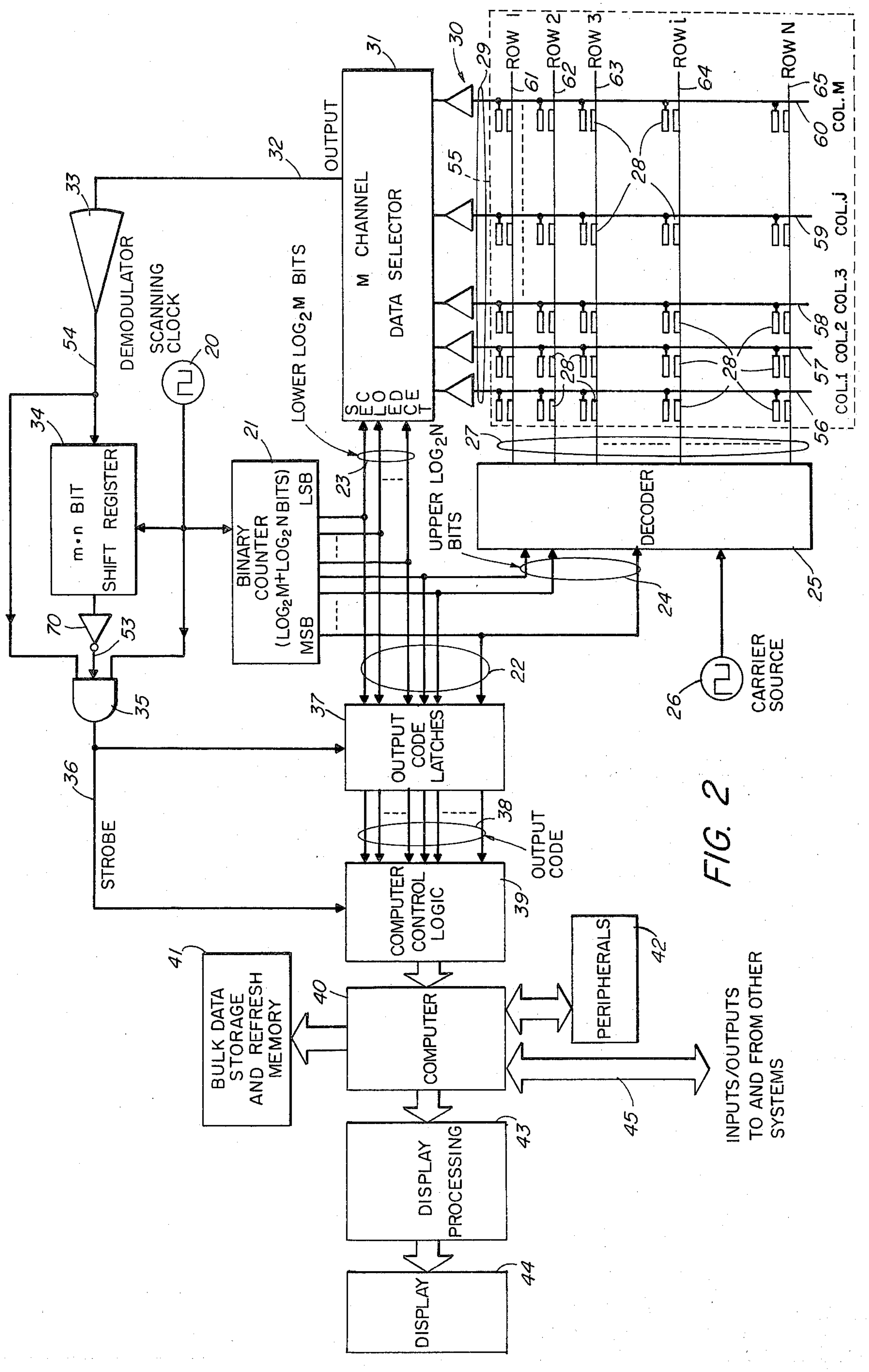
FIG. 2 is a functional flow diagram illustrating the principle of operation of the embodiment of the invention illustrated in FIG. 1.

Referring now to FIG. 2, there is shown a functional flow diagram illustrating the preferred embodiment of this invention in which there is illustrated generally at 55 a capacitive key switch matrix. Matrix 55 is preferably an N row by M column matrix with capacitive switches 28 at all or some of the $M \times N$ junctions.

Capacitive switches 28 are shown in greater detail in FIG. 4. The key caps 46 may be engaged by the operator's fingertips and pushed downward opposed by the spring 48. Support plate 49 is used for retention of the key caps 46, stems 47 and upper capacitive plates 50. When a key cap 46 and stem 47 are pushed downward towards a dielectric insulation layer 66, the two capacitors formed, one by plates 51 and 50 and the other by 52 and 50, begin to increase in value and reach a maximum when plate 50 is in contact with dielectric insulation layer 66. At that point, there is also a maximum amount of capacitance between plates 51 and 52 formed by the series combination of these two capacitor plates 51 and 50, and 52 and 50. The capacitance changes with such a system are typically two to one thereby giving a significant and detectable capacitance change. An insulating layer 71 supports dielectric insulation layer 66 and plates 51 and 52. The spacing between insulating layer 71 and support plate 49 is fixed by a spacer 87 which determines the key stroke length.

To detect the capacitance changes, a scanning technique is used. As shown in FIG. 2, a scanning clock 20 provides a clock input to a binary counter 21 whose outputs are divided into two groups. One group 23 is connected to the code selection inputs of an M channel data selector 31 and the other group of buses 24 is connected to a decoder 25. As may be seen by simple mathematics, if the keyboard matrix has N rows, each of which is addressed by a single binary code, it would require $\log_2 N$ binary coded bits to be able to address the N rows through the decoder 25. For example, if there are $N = 8$ rows in any matrix, it would require $\log_2 8 = 3$ address lines to address those 8 bits. Similarly, for the M columns it would require $\log_2 M$ bits to address these M columns through the data selector 31. If $\log_2 M$ or $\log_2 N$ is not an integer, then the next highest integer must be used for each to have enough address lines since there can only be an integer number of data lines. Hence, the number of bits necessary for the scanning counter are $\log_2 M + \log_2 N$ bits where the next highest integer is used when necessary.

The binary counter 21 cycles continuously, addressing each row through the upper $\log_2 N$ bits of the counter output. These upper $\log_2 N$ bits select the row inputs one at a time in sequence. Superimposed upon this selection signal is a relatively high frequency carrier, for example 1 MHz, supplied by carrier source 26 so that the output signals from decoder 25 are sequential bursts of the relatively high frequency carrier from carrier source 26. The carrier frequency must be chosen so that it is substantially higher than the scanning clock frequency and also high enough to produce sufficient voltage via the available capacitive coupling of a depressed key switch 28 in order to energize the high impedance gates 30 when a key is depressed.

The lower $\log_2 M$ bits from the scanning counter are used to select the column input which is coupled through the M channel data selector 31 to demodulator 33. The data selector inputs arrive at a frequency $2^M$ times the scanning frequency of the decoder 25 since the data selector 31 is driven by the lower order bits from the scanning counter 21. The net effect is that the rows are energized sequentially with the burst of the relatively high frequency carrier and, while one row is energized, the column inputs sequentially are routed through the data selector so that an entire scan of the M columns is made while a single row is being addressed and the carrier is applied through the decoder 25. Hence, there will be a unique time period each scan cycle corresponding to each intersection of the rows and columns. Thus, when one of the keys is depressed, a burst of the relatively high frequency carrier will appear at the output 32 of the data selector 31 for a period of one scanning clock 20, for example, about 60 microseconds. The high frequency burst is removed by demodulator 33 and shaped into a square pulse which is imposed upon line 54.

FIG. 5 shows one possible implementation of the decoder 25 of FIG. 2 which may be used whenever eight or less outputs are required from the decoder. This implementation uses only a commonly available single binary coded decimal-to-decimal decoder/driver, such as the Texas Instruments Co. SN7445, to accomplish the decoder function.

FIG. 6 is a truth table of inputs and outputs for the decoder 22 wherein a logic 0 represents a relatively low voltage level and a logic 1 represents a relatively high voltage level where these voltage levels are compatible with the logic voltage levels in connecting parts of the circuitry. An output is selected when a 0 appears in the table for that output position. Referring now to the table, since only the first eight outputs are to be used, only inputs in the range 0000 to 0111 (binary 0 to binary 7, a range of 8) need be used to activate outputs 0 to 7 respectively. The most significant bit in this binary sequence of 0000 to 0111 is always 0 for inputs in this range. Furthermore, if the most significant bit is changed to 1, none of the used outputs is activated regardless of the status of the three least significant bits since outputs 8 and 9 are not used and since no output is produced when the value of the input exceeds binary 1001. The result is that a selected output may be deselected by imposing a 1 condition on the most significant bit. When the carrier source 26 with a substantially square wave output is connected to this most significant bit, the output selected by the three least significant bits will be alternately selected and deselected at the carrier frequency thus producing a modulation of the signal on the selected output.

While the outputs from the binary counter 21 have been addressing the data selector 31 and decoder 25, they have also been present at the inputs of the output code latches 37. However, they are not stored in the latches until a pulse is received from line 36 through AND gate 35. The scanning clock 20 signal is logically AND'ed at this point with the pulse from the demodulator output 54 from line 54 to produce a clock pulse to strobe the data into the output code latches 37. Shift register 34 also receives this pulse from line 54. The shift register has an M × N bit length, the same number of bits as in a complete scan of the keyboard matrix. The shift register output is used to inhibit pulses on line 54 through AND gate 35 after the first pulse from line 54 for each key depression. The first time any key 28 is depressed and a pulse is imposed upon line 54, the pulse will be passed to the output latches 37 as well as into shift register 34. The pulse will appear at the end of the shift register 53 at the same time that a second pulse (assuming that the key is still held down) appears at the input of the shift register 34 on the next scan cycle. The time for a pulse to pass through the shift register, since it is an M × N bit shift register, is equal to the total matrix scan time. The pulse on the output 36 of the shift register will coincide exactly in time with the second pulse on line 54. Thus, the inverted shift register output 53 will inhibit any pulses after this first pulse from reaching line 36 so that only one strobe appears on line 36 for each depression of a key. The result is what is known in the art as N-key roll-over protection.

When the strobe is received at the output code latch 37, the strobe causes the value then on the inputs of the output code latches 22 to be transferred and stored as the outputs of the output code latches 37. This value of the counter output and input to the code latches 22 represents a unique count from the binary counter 21 corresponding to a unique key position in the matrix. Thus, with proper location of keys on matrix intersection points, any desired code may be produced with this particular embodiment.

While the output code has been stored in the output code latches 37 and coupled to output lines 38, the same strobe on line 36 which initiates this storage is sent to the computer logic 39 to indicate that a new code is ready for processing by the computer 40. The computer 40 with the aid of programs from peripherals 42 and memories 41 formats this data for use in the display processing circuitry 43 for use by the circuitry in the display 44. In a typical systems operation, other inputs from other peripherals and possibly other keyboards may be brought into the computer through external inputs 45 so that a plurality of keyboards may send information through a single computer to either a single display or a plurality of displays. In a typical application, the input code from the keyboard would be taken into the computer 40 and put into an appropriate location in memory 41 to be in a sequence of data for use by the display 44.

Figure 3:
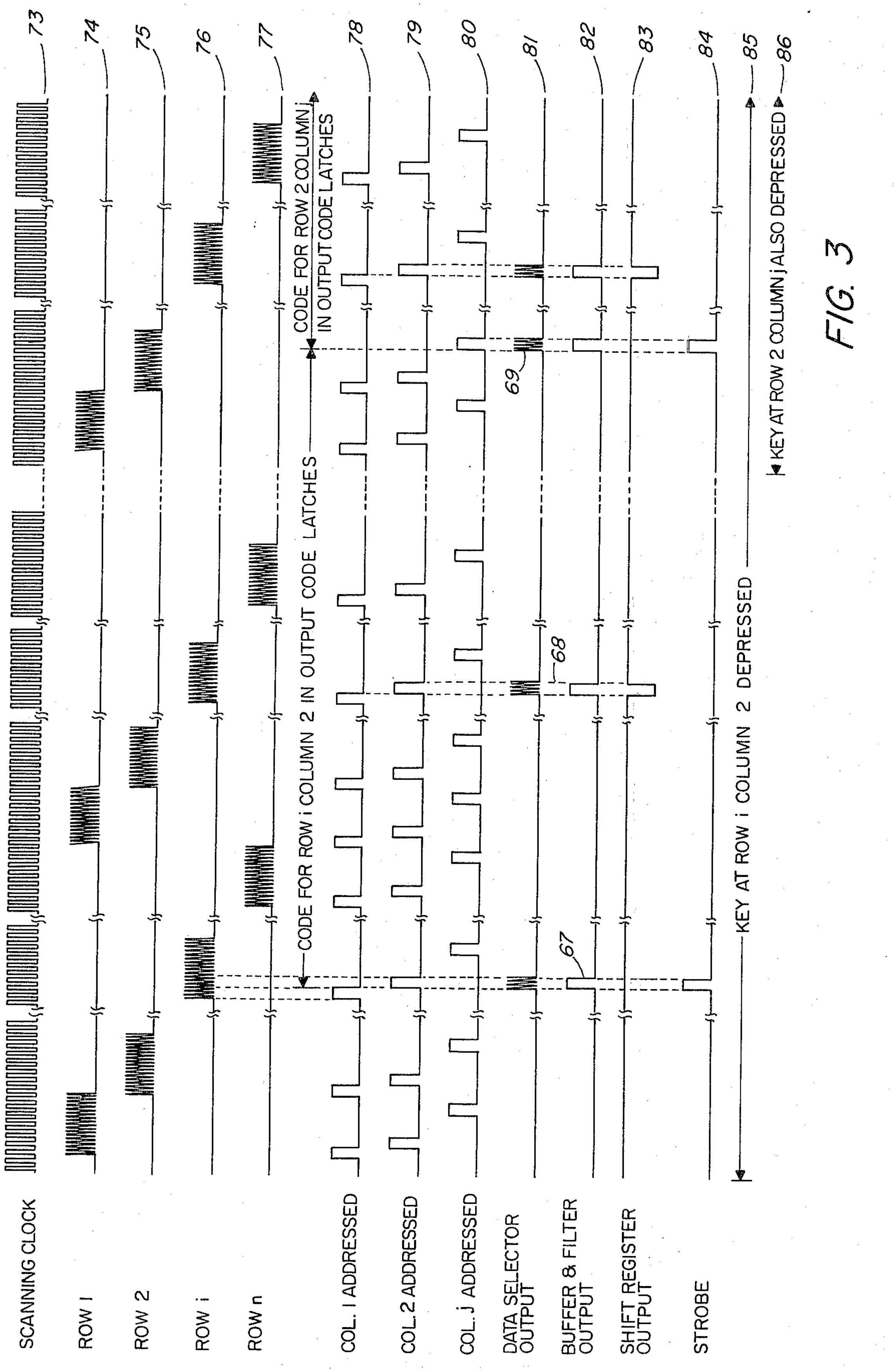
FIG. 3 is a timing diagram for the embodiment of the invention shown in FIG. 2.

FIG. 3 is an overall timing diagram of the preferred embodiment. At 73 is shown the square-wave scanning clock which runs continuously. The frequency of the scanning clock is chosen to be high enough to scan the entire matrix at a rate faster than any operator can type on the keys. 74, 75, 76, and 77 show the signals applied respectively to rows 1, 2, *i* and N. These signals are applied continuously in the order shown. Row *i* is an arbitrary row somewhere between rows 2 and N to illustrate all the rows that fall therebetween. The carrier source signal is a great deal higher than the scanning clock frequency, as mentioned earlier. In this particular illustration, each row signal encompasses 8 periods of the scanning clock, that is to say that 8 columns are addressed and tested during the time that one row signal is on line making for a total of 8 columns in that matrix although an arbitrary number can be used. 78, 79, and 80 show the columns that are addressed during the row time slots. The time during which column 1 is coupled to the demodulator 33 is shown at 78, for column 2 at 79, and for an arbitrary column *j* at 80. Three complete cycles are shown in this timing diagram. The first two are consecutive scan periods during which time the key at row *i*, column 2 is depressed as is illustrated at 85. The third cycle, after a break in time, illustrates the case in which two keys are depressed. In the third cycle the key at row *i*, column 2 remains depressed from earlier while the key at row 2, column *j* is depressed just before the start of the cycle.

The sequence of events once the first key has been depressed is as follows. The first key depressed is the one at row *i*, column 2 as shown at 85. When column 2 is addressed during the time that row *i* is being addressed, as shown generally at 67, that portion of the row *i* signal which occurs during that address time is gated out through the data selector 31, as was explained in conjunction with FIG. 2. The carrier signal is removed by the demodulator 33 thereby producing a strobe pulse during the column 2, row *i* time, as is shown at 82. This strobe is gated through AND gate 35 shown in FIG. 2 and is used to strobe the data into the output latches 37, as shown also in FIG. 2. This pulse is also connected to the input of the M × N bit shift register 34 of FIG. 2 and started down that register at the scanning clock rate which will cause it to appear at the output of the register at the same time the decoded pulse from row *i*, column 2, again appears at the output of the demodulator 33. The output of the shift register, which is inverted by inverter 70 as shown here at 83, is used to inhibit the second pulse generated through the demodulator 33 so that only a single strobe pulse is produced for each key depression. This is shown at 84 and generally at 68 showing where the shift register output has inhibited the strobe pulse.

The third cycle illustrates what happens when a second key is depressed while the first key remains depressed. In that case, two different bursts of the carrier will be gated out through the data selector 31 during each scanning cycle, one for each key. In this third cycle the key at row 2, column *j*, as illustrated at 86, is depressed thereby producing the second pulse from the data selector 31 during the time slot for row 2, column *j*, as is illustrated at 69. The shift register output will not inhibit this second pulse from reaching the strobe line 36 until it has passed down the shift register a first time. Therefore, a pulse will be produced at the output of the AND gate 35 the first time that this second key is depressed as for the first key. If this key were to remain depressed into a succeeding cycle, the shift register output would inhibit both the pulse corresponding to this key depression and the pulse corresponding to the eariler depression to the key at row *i*, column 2. Hence, no output would be impressed on the strobe line 36 after the second key was held down longer than necessary to produce the first pulse. Furthermore, if a third key were depressed, it too would produce a burst on the output of the data selector 31 so that there would be a total of three pulses as long as the three keys were held down. Again, by means of this shift register 34 and its inhibiting function, this pulse would be inhibited on the strobe line 36 on all but the first cycle that the key was depressed.

This circuit technique, whereby only a single ouput strobe is produced for a single key depression and whereby multiple keys may be held down while further keys are depressed, yet only a single output strobe is generated, produces the N-key roll-over. It is to be noted that with the present invention that only an M × N bit shift register and appropriate gating are necessary to produce this N-key roll-over.

It should be understood that the foregoing disclosure refers only to a preferred embodiment of the invention and that numerous modifications and alterations may be made thereto without departing from the spirit and scope of the invention as set forth in the appended claims.

What is claimed is:

1. In combination:

a matrix of capacitive key switches, said matrix having first and second sets of conductors;

means for providing a count;

means for providing a carrier signal;

means for applying said carrier signal to said first set of conductors one at a time in response to said count providing means; and means for detecting the conductor of said first set of conductors to which said carrier signal is applied and to which conductor of said second set of conductors and carrier signal is coupled by a selected one of said key switches.

2. The combination as set forth in claim 1 wherein said key switches comprise:

first and second stationary plates and a movable plate, said first stationary plate being coupled to a conductor of said first set of conductors and said second stationary plate being coupled to a conductor of said second set of conductors.

3. The combination as set forth in claim 1 wherein said detecting means comprises:

means to selectively couple said second set of conductors one at a time to demodulator means in response to said count providing means;

means to demodulate said carrier signal; and means to generate a first output state when the said carrier signal is present and a second output state when the said carrier signal is not present.

4. The combination as set forth in claim 3 wherein said detecting means further comprises:

means to store the count from said count providing means; and means to prevent said count from being stored more than once for each selection of a key switch.

5. The combination of claim 4 further comprising means for coupling said means to store said count to data processing means.

6. The combination as set forth in claim 1 wherein said means for applying said carrier signal to each conductor of the said first set of conductors comprises:

means to convert from a binary code to a single activated line unique to each binary code number wherein said carrier signal is connected as the most significant bit of said binary code.

7. A keyboard comprising in combination:

means to produce a continuously cycling binary count;

a carrier signal source;

means for applying said carrier signal to a first set of conductors one at a time in response to the higher order bits of said binary count;

means to selectively couple said carrier signal from a conductor of said first set of conductors to a conductor of a second set of conductors;

means to couple in response to the lower order bits of said binary count said second set of conductors one at a time to a demodulator means;

means to demodulate said carrier signal; and means to store the said binary count.

8. The combination as set forth in claim 7 wherein shift register means is connected to the output of said demodulator, said shift register means having the same delay time as the time required for a complete cycle of said means to produce a continuously cycling binary count such that the output of the shift register cooperates with the output of the said demodulator so as to prevent the count corresponding to a key switch from being stored more than once each time that key switch is depressed.

9. The combination as set forth in claim 7 wherein said means for applying said carrier signal comprises:

a binary decoder to convert from a binary code to a single activated output line; and a carrier signal source, said signal source connected to said decoder as the most significant bit of the binary code.

10. The combination as set forth in claim 7 wherein said means to couple said carrier signal comprises a capacitive key switch.

11. The combination as set forth in claim 7 wherein said means to couple said second set of conductors one at a time to a demodulator comprises a multiplexer means with a plurality of data inputs and a single data output.

12. A keyboard comprising in combination:

a six-bit continuously cycling binary counter;

a four line to ten line binary coded decimal-to-decimal decoder/driver, said decoder/driver having the three least significant bits of its input connected to the three most significant bits of the said binary counter;

a first set of eight conductors connected to the zeroth through the seventh outputs of said decoder/driver;

a second set of eight conductors;

a plurality of capacitive key switches, said capacitive key switches having first and second terminals, said first terminal of each of said capacitive key switches connected to one conductor within said first set of conductors and said second terminal of each of said capacitive key switches connected to one conductor within said second set of conductors;

means to amplify the signals on each of the said second set of conductors;

an eight input digital data multiplexer, the outputs of said amplifying means connected to the data inputs of said multiplexer and the three least significant bits of said binary counter connected to the data selection inputs of said multiplexer;

demodulator means, the input of said demodulator means connected to the output of said multiplexer means;

a 64-bit shift register, the clock input of said shift register being connected to the same clock source as the said six-bit continuously cycling binary counter and the data input of said shift register means being connected to the output of said demodulator;

an output storage means having a plurality of data inputs and outputs and a single clock input, some of the data inputs of said output storage means connected to the outputs of the said six-bit continuously cycling binary counter; and gating means, one or more of the inputs of said gating means connected to the output of said shift register, one or more of the inputs of said gating means connected to the output of said demodulator, one or more inputs connected to the same clock source as the said six-bit continuously cycling binary counter, and the output of said gating means connected to the clock input of said output storage means.

* * * * *